United States Patent [19]

Groh et al.

[11] 4,074,848

[45] Feb. 21, 1978

[54] METHOD OF SEALING

[75] Inventors: Edward F. Groh, Naperville, Ill.; Dale A. Cassidy, Valapariso, Ind.

[73] Assignee: The United States of America as represented by the United States Department of Energy, Washington, D.C.

[21] Appl. No.: 763,167

[22] Filed: Jan. 27, 1977

[51] Int. Cl.² .............................................. B23K 1/00
[52] U.S. Cl. .................................................. 228/173 C
[58] Field of Search ........... 228/173 R, 173 C, 173 E, 228/174, 5.1, 15.1, 904; 174/65 R

[56] References Cited

U.S. PATENT DOCUMENTS

| | | | |
|---|---|---|---|
| 2,912,513 | 11/1959 | Robinson | 174/65 R X |
| 2,939,022 | 5/1960 | Groutage | 310/71 |
| 3,001,275 | 9/1961 | Rehrig | 228/173 E |
| 3,451,122 | 6/1969 | Kuhns | 228/173 E |

Primary Examiner—Donald G. Kelly
Attorney, Agent, or Firm—Dean E. Carlson; Arthur A. Churm; Frank H. Jackson

[57] ABSTRACT

A thermocouple lead or other small diameter wire, cable or tube is passed through a thin material such as sheet metal and sealed thereinto by drawing complementary longitudinally angled, laterally rounded grooves terminating at their base ends in a common plane in both sides of the thin material with shearing occuring at the deep end faces thereof to form a rounded opening in the thin material substantially perpendicular to the plane of the thin material, passing a thermocouple lead or similar object through the opening so formed and sealing the opening with a sealant which simultaneously bonds the lead to the thin material.

2 Claims, 2 Drawing Figures

METHOD OF SEALING

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

This invention relates to a method of sealing a thermocouple lead or other small diameter wire, cable or tube in a thin wall. In more detail, the invention relates to a method of penetrating thin sheet metal with an instrument lead and sealing the opening. In still more detail, the invention relates to a method of penetrating thin sheet metal with a thermocouple lead in a direction substantially parallel to the plane of the sheet metal and sealing the opening.

In many installations it is necessary to run instrument leads from the interior through a wall to the exterior thereof. For example, this might be done if it is necessary to monitor the temperature within the installation with a thermocouple. The simplest way to accomplish this undoubtedly would be to drill a hole in the wall, pass the instrument lead through the hole and seal the hole. Several difficulties are encountered by this procedure. For example, the amount of sealing surface is determined by the thickness of the wall being penetrated and is accordingly limited to such an extent that the seal constitutes a point of weakness. Also the instrument lead comes out of the hole at right angles to the wall and would have to be bent twice at right angles to pursue a course substantially parallel to the plane of the wall.

SUMMARY OF THE INVENTION

According to the present invention, a small diameter wire or tube — such as an instrument lead — is passed through a barrier material by drawing complementary longitudinally angled grooves terminating at their base ends in a common plane in both sides of the barrier material with shearing occurring at the deep end face thereof, to form a rounded opening in the barrier material substantially perpendicular to the plane of the barrier material, passing a thin wire or tube through this opening and sealing the opening.

DESCRIPTION OF THE INVENTION

Figure 1:
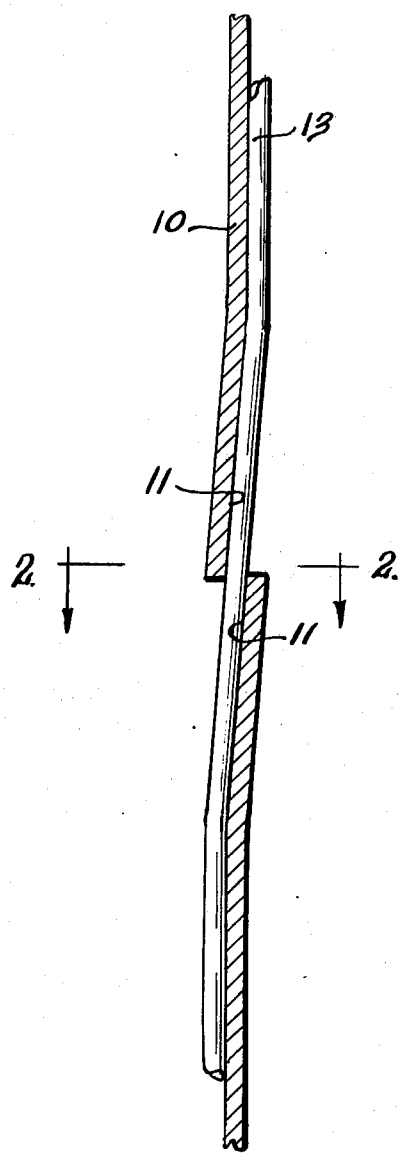
FIG. 1 is a view taken through a section of a barrier wall showing a small diameter tube sealed thereinto by the method of the present invention and FIG. 2 is a sectional view taken on the line 2—2 in FIG. 1.
Figure 2:
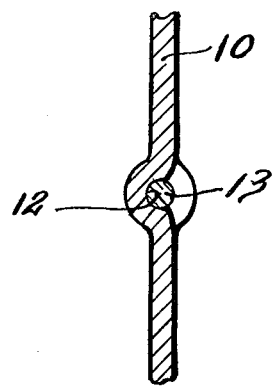

The invention will be discussed initially with respect to one embodiment of the invention developed for a specific application and then the general utility thereof will be made clear. The drawing shows a thermocouple lead penetrating a barrier wall consisting of a stainless steel sheet and sealed thereto and the method of the present invention is best described by referring thereto. As shown in the drawing, a stainless steel sheet 10 has complementary, longitudinally angled, laterally rounded grooves 11 impressed in the sheet one on each side of the sheet terminating at their base ends in a common plane. By virtue of the method of formation of grooves 11 a rounded opening 12, oriented substantially vertically to the plane of the sheet, appears in the sheet 10 in the plane of intersection of the two grooves 11. A thermocouple lead 13 extends through opening 12 in a direction substantially parallel to the plane of the sheet.

The method of the present invention will now be described referring to this drawing. Grooves 11 are formed in sheet 10 by drawing each side of the sheet separately against a tool steel die having a longitudinally angled, laterally rounded cavity therein, the base end face of which constitutes a shearing surface, employing a rounded, angled chisel punch. When this operation is carried out with the base end faces of both grooves 11 in a common plane, a rounded opening 12 oriented substantially vertically to the plane of the sheet is formed in sheet 10. Thermocouple lead 13 is inserted in opening 12 and the opening is sealed and the thermocouple lead simultaneously bonded to the sheet with silver solder. To provide an opening of the desired size, the depth of the draw is one-half the diameter of the lead.

To obtain a rounded opening — minimizing the amount of sealant required — the bottom of the die is rounded in cross section as is the bottom of the forming chisel. The thickness of the forming chisel is equal to the thickness of the thermocouple lead plus twice the thickness of the stainless steel sheet.

A 40 mil (0.1 mm) thermocouple lead was sealed into a 35 mil (0.09 mm) thick type 304 stainless steel sheet as described above and the seal was tested by subjecting it to 2200 pounds per square inch (15 $\times$ 10$^7$ dynes per square centimeter) hydrostatic pressure. At this pressure the stainless steel sheet started to yield but the seal did not fail.

The invention, of course, is useful for sealing any kind of a thin wire, cable or tube into a thin sheet of material. For example, thermocouple leads — or other instrument leads — can be thus sealed into sheet metal having a thickness of from about 10 mil ($\sim$ 0.25 mm) thickness up to about one-eighth inch ($\sim$ 3 mm) in thickness. For metals or other materials which cannot tolerate the temperatures required for silver soldering, soft (lead-zinc) solder may be used and for plastic sheet material, epoxy may be used as sealant.

A particular advantage of the present invention is that the sealing surface is greatly increased over that available when a hole is drilled in the sheet material, the sealing surface about doubling. This, of course, greatly increases the strength of the seal. In addition, use of the present method makes it possible to run an instrument lead or other thin wire, cable or tube through a wall in a direction substantially parallel to the plane of the wall without gross bending of the instrument lead.

The embodiments of the invention in which an exclusive property or privilege is claimed are defined as follows:

1. A method of penetrating thin sheet metal with a thermocouple lead and sealing the thermocouple lead into the sheet metal comprising drawing complementary longitudinally angled, laterally rounded grooves terminating at their base ends in a common plane in both sides of the thin material with shearing occuring in the plane of the base ends to form a round opening substantially perpendicular to the plane of the sheet metal, passing a thermocouple lead through this opening and sealing the opening with silver solder which simultaneously bonds the thermocouple lead to the sheet metal.

2. Method according to claim 1 wherein the sheet metal is 35-mil stainless steel and the thermocouple lead is 40-mil thick and wherein the grooves are formed in the sheet metal by drawing the sheet from each side to a depth of one-half the diameter of the lead against a tool-steel die using an angled chisel punch having a thickness equal to the diameter of the thermocouple plus twice the thickness of the sheet metal.

* * * * *